United States Patent [19]

Watanabe et al.

[11] Patent Number: 5,854,636
[45] Date of Patent: Dec. 29, 1998

[54] SEMICONDUCTOR IC WITH A PLURALITY OF PROCESSING CIRCUITS WHICH RECEIVE PARALLEL DATA VIA A PARALLEL DATA TRANSFER CIRCUIT

[75] Inventors: Takao Watanabe, Fuchu; Yoshinobu Nakagome, Hamura; Kazuo Ishikura, Kunitachi; Tetsuya Nakagawa, Koganei; Atsushi Kiuchi, Kunitachi, all of Japan

[73] Assignee: Hitachi, Ltd., Tokyo, Japan

[21] Appl. No.: 931,776

[22] Filed: Sep. 16, 1997

Related U.S. Application Data

[63] Continuation of Ser. No. 412,968, Mar. 29, 1995, abandoned.

[30] Foreign Application Priority Data

Apr. 11, 1994 [JP] Japan .................................. 6-071821

[51] Int. Cl.⁶ .................................................. G06F 13/00
[52] U.S. Cl. ........................................ 345/507; 348/571
[58] Field of Search ........................ 365/189.01, 230.02, 365/230.03; 382/279, 302, 303, 304; 345/507; 348/571

[56] References Cited

U.S. PATENT DOCUMENTS

| | | | |
|---|---|---|---|
| 4,298,950 | 11/1981 | Smith, Jr. ................................. | 364/726 |
| 4,550,437 | 10/1985 | Kobayashi et al. ..................... | 382/304 |
| 4,635,292 | 1/1987 | Mori et al. .............................. | 382/304 |
| 4,733,376 | 3/1988 | Ogawa ..................................... | 365/221 |
| 4,970,688 | 11/1990 | Minagawa et al. ................. | 365/189.01 |
| 5,163,100 | 11/1992 | Mathieu et al. ......................... | 382/304 |
| 5,321,510 | 6/1994 | Childers et al. ......................... | 348/571 |
| 5,524,075 | 6/1996 | Rousseau et al. ....................... | 382/302 |

OTHER PUBLICATIONS

Kobayashi, Yoshiki, et al. "A BiCMOS Image Signal Processor with Line Memories," ISSCC Digest of Technical Papers, Feb. 1987, pp. 182–183. (provided in English).

*Primary Examiner*—Tod R. Swann
*Assistant Examiner*—Christopher S. Chow
*Attorney, Agent, or Firm*—Fay Sharpe Beall Fagan Minnich & McKee

[57] ABSTRACT

A semiconductor integrated circuit having a two-dimensional array (MAR) and a parallel data transfer circuit (TRC) for transferring from the array data read out in parallel through data lines, in parallel to a processing circuit group (PE) by selecting the word lines of the two-dimensional memory array. The processing circuit group executing processing operations in parallel by using the data transferred from the parallel data transfer circuit. Each of the processing circuits having access to a plurality of series word lines and the data lines of the two-dimensional array through the parallel data transfer circuits. The arrangement of the parallel data transfer circuits allowing for an overlap range wherein data from each of the data lines of the memory array is available to more than one of the parallel data transfer circuits. Since the data lines of the two-dimensional memory array have the overlapped range, convolution processing operations or the like can be executed in parallel for the two-dimensional data stored in the two-dimensional memory array in a high parallelism and at a high speed.

28 Claims, 11 Drawing Sheets

FIG. 1
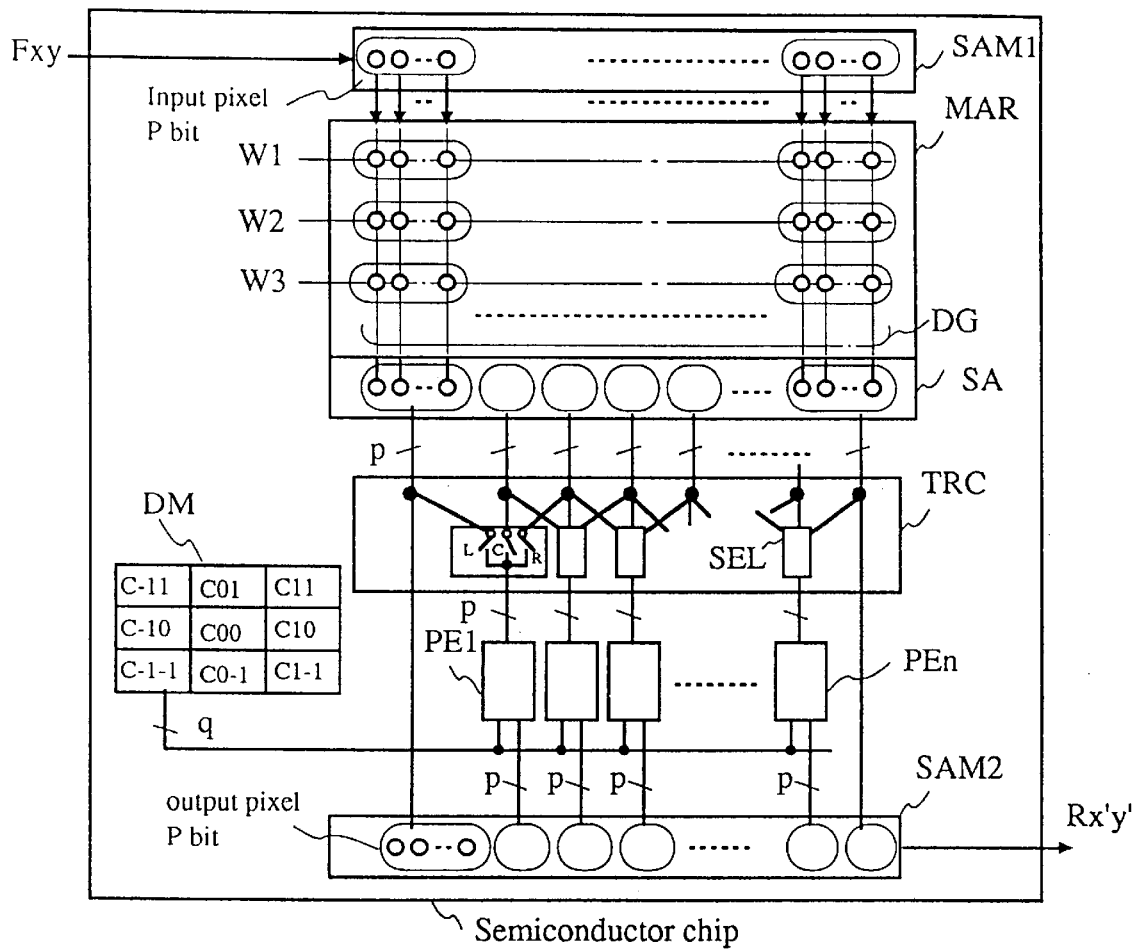
Frame of the input image
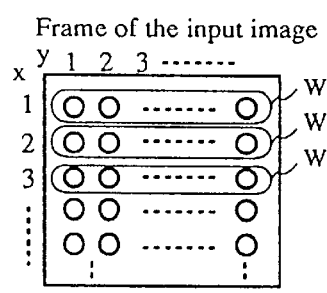
Frame of the output image after processing
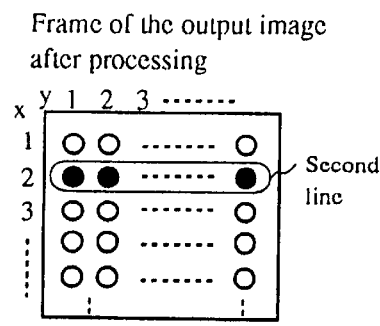
Control sequence of the parallel data transfer circuit
| Processing cycle | Active transfer switch | Active word line | Input coefficient |
|---|---|---|---|
| 1 | L | W1 | C-1-1 |
| 2 | C | ↑ | C-10 |
| 3 | R | ↑ | C-11 |
| 4 | L | W2 | C0-1 |
| 5 | C | ↑ | C00 |
| 6 | R | ↑ | C01 |
| 7 | L | W3 | C1-1 |
| 8 | C | ↑ | C10 |
| 9 | R | ↑ | C11 |

FIG. 2A Block Diagram (Prior Art)
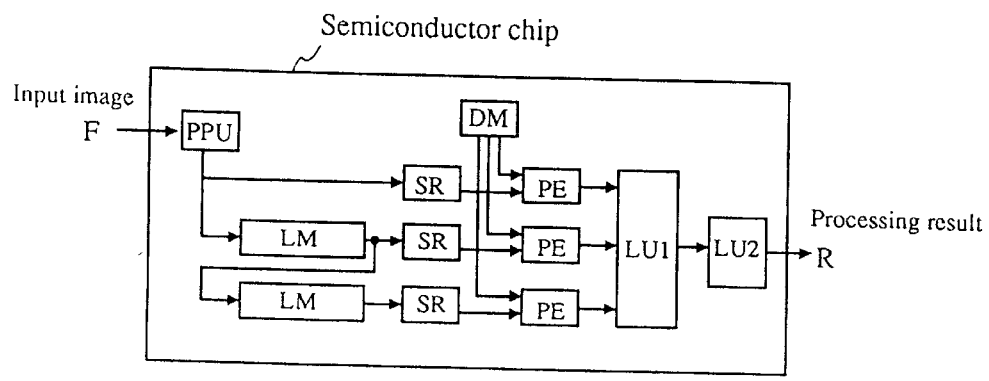
FIG. 2B Processing of the 3x3 space filtering
(Prior Art)
$$R_{xy} = \sum_{i,j=-1,-1}^{1,1} F(x+i)(y+j) * W_{ij}$$
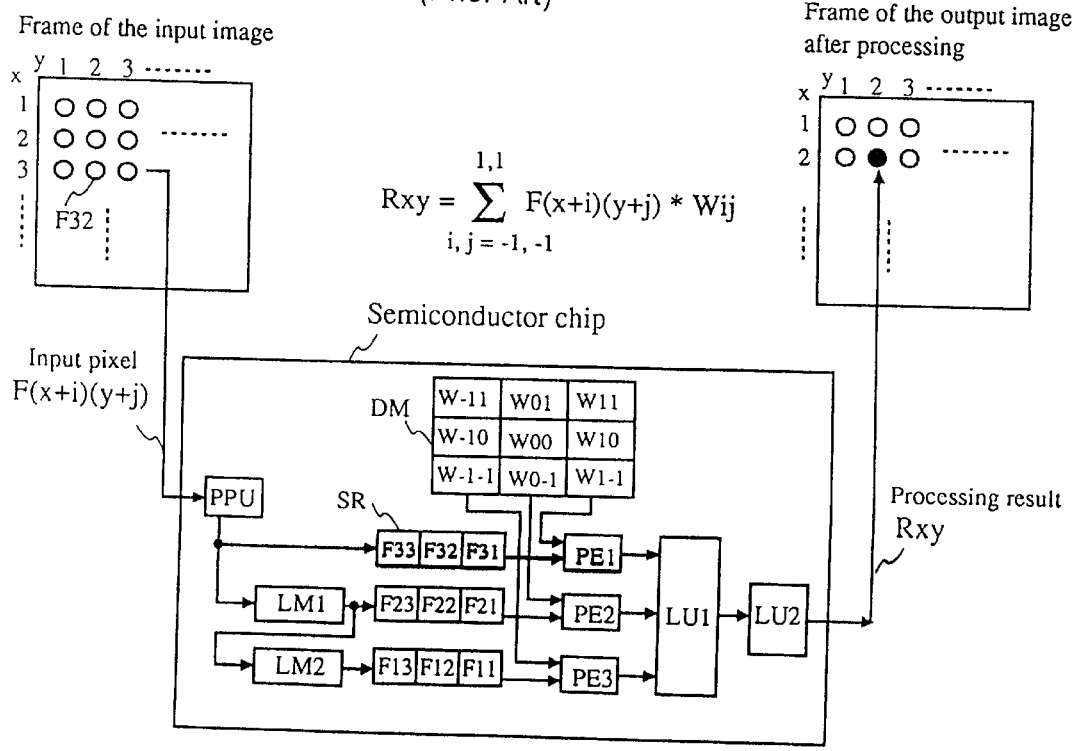

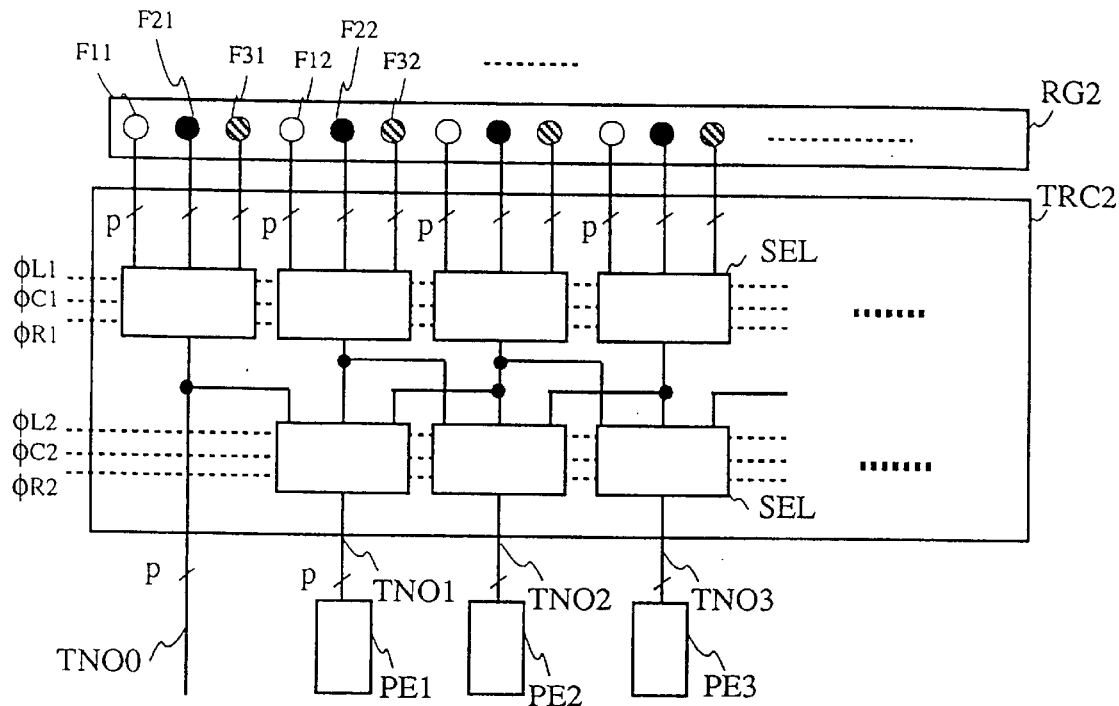
FIG. 5A Transfer network
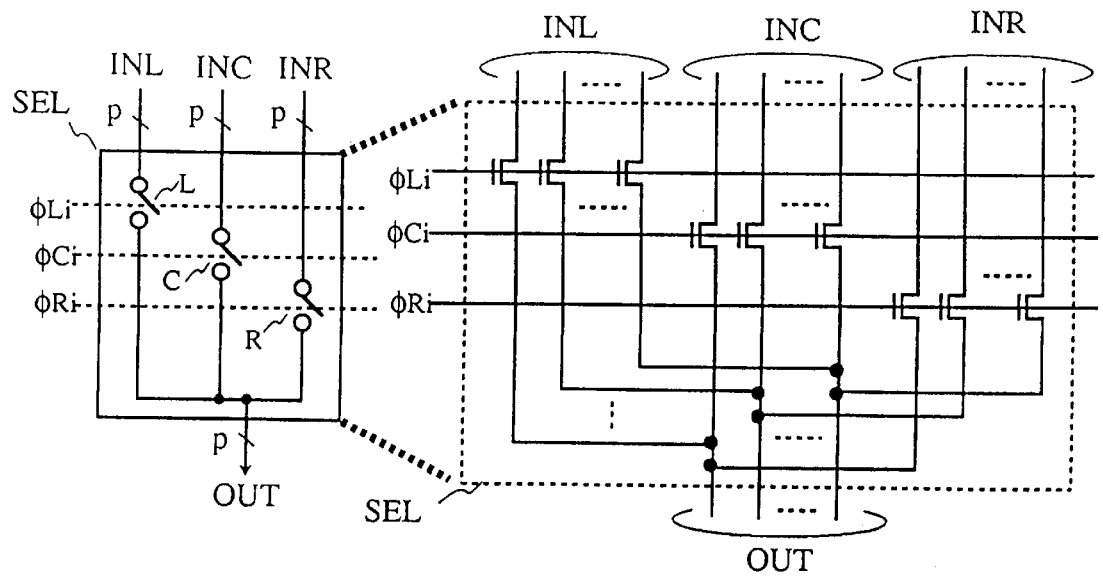
FIG. 5B Selector SEL

FIG. 8A Parallel data transfer circuit
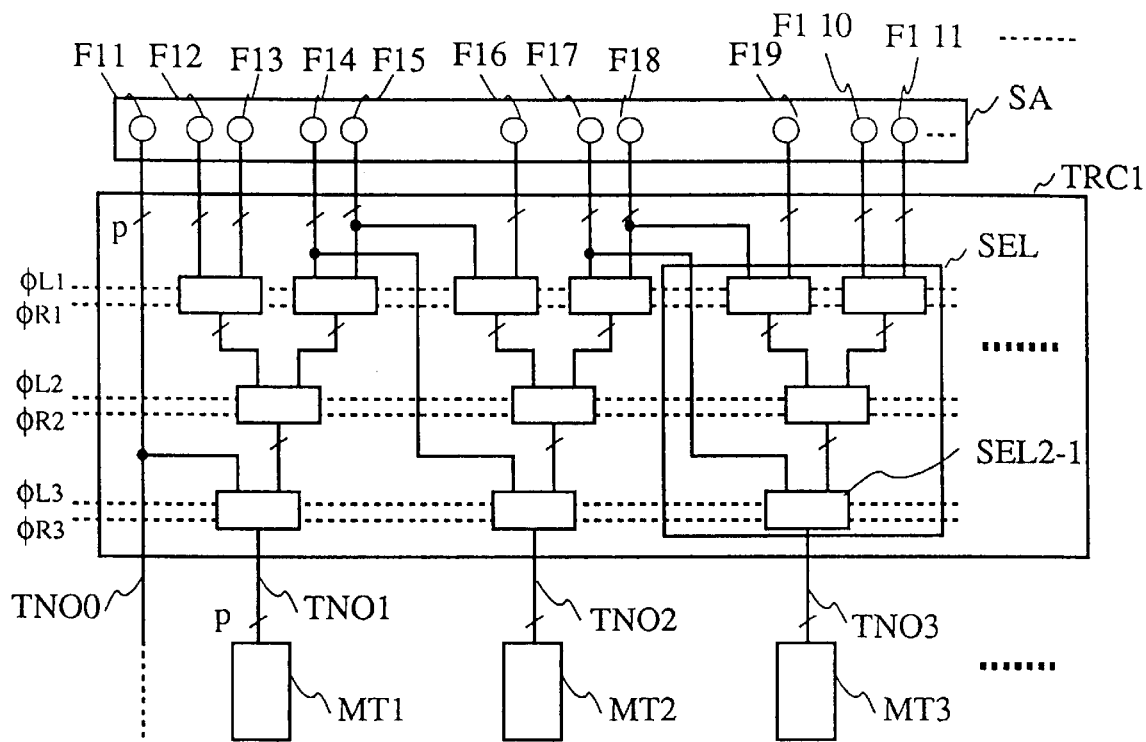
FIG. 8B Selector
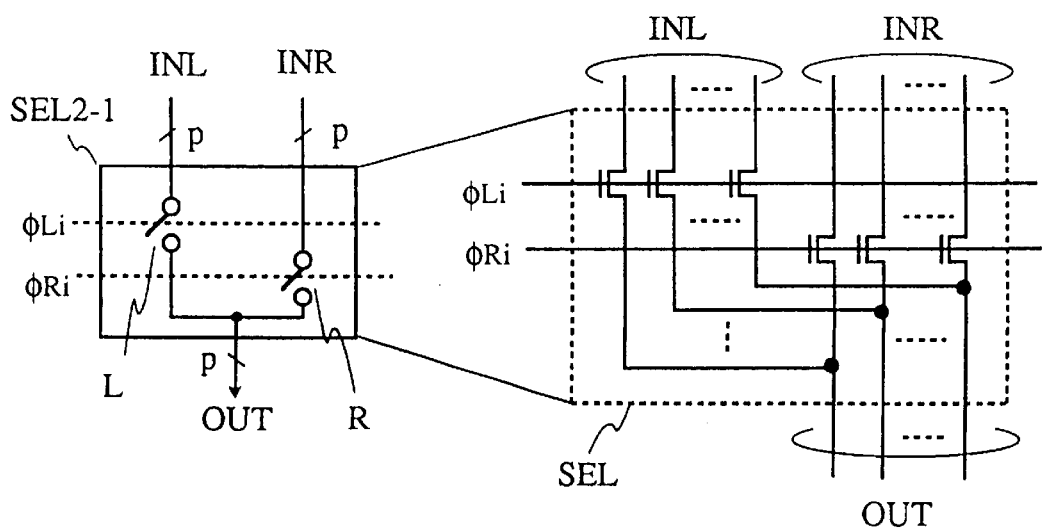

SEMICONDUCTOR IC WITH A PLURALITY OF PROCESSING CIRCUITS WHICH RECEIVE PARALLEL DATA VIA A PARALLEL DATA TRANSFER CIRCUIT

This is a continuation of application Ser. No. 08/412,968, filed Mar. 29, 1995 now abandoned.

BACKGROUND OF THE INVENTION AND SUMMARY OF THE INVENTION

The present invention relates to a semiconductor integrated circuit using a two-dimensional memory array and, more particularly, to a semiconductor integrated circuit which is suited for executing either a digital filter processing operation such as a convolution processing operation or a processing operation using two-dimensional data such as a search of the moving vector of a moving image, on real time.

Of the various information processing operations handling two-dimensional data, the image processing operation has a two-dimensional array of pixels on a CRT display so that the two-dimensional data are frequently processed. These information processing operations are represented by a two-dimensional filter processing operation.

FIG. 2 shows a semiconductor integrated circuit of the prior art for processing an image. This device is suitable for the two-dimensional filter processing operation, as disclosed by Yoshiki Kobayashi, Tadashi Fukushima, Syuichi Miura, Morio Kanasaki and Kohtaro Hirasawa, "A BiCMOS Image Processor with Line Memories", ISSCC Digest of Technical Papers, pp. 182–183, February 1987.

Here will be summarized the semiconductor integrated circuit of FIGS. 2A and 2B. As shown in FIG. 2A, this semiconductor integrated circuit is constructed to comprise; a pre-processing circuit PPC for executing a pre-processing operation such as a threshold processing operation of input image data; line memories LM1 and LM2 for storing images of one line to establish a delay of one line; a shift register SR; a data memory DM for storing the weighting coefficient of a filter; a processing circuit PE; and linkage units LU1 and LU2 including adders. FIG. 2B shows an example of the calculation of the case in which the semiconductor integrated circuit of FIG. 2A is used for calculating the 3×3 space filter. In FIG. 2B, reference characters F32 and F(x+i)(y+i) designate the (density) value of a pixel of a third row and a second column in the frame of an input image, and the value of a pixel of a (x+i)-th row and a (y+i)-th column, respectively. Moreover, characters Wij, W-1-1, - - -, and W11 designate filter coefficients, and characters Rxy designate the value of a pixel of an x-th row and a y-th column in the frame of the processed output image. The operations of the semiconductor integrated circuit of FIG. 2A will be described with reference to FIG. 2B. In the calculation of 3×3 space filter, as well known in the art, the value of Rxy can be expressed by the summation of the products of the values of the pixels of the input images and the filter coefficients, as expressed by Equation in FIG. 2B. In order to determine the value of Rxy, there is required the values of the pixels of nine input images around the pixel of the x-th row and the y-th column in the frame of the input image. The image data inputted are inputted at first to the pre-processing circuit PPU. Since the filter processing operation needs no threshold processing, the inputted image data are transmitted as they are to the shift register SR and the line memory LM1. The output of the line memory LM1 is outputted with a delay of one line. The output of the line memory LM1 is inputted to the line memory LM2 so that it is outputted with an additional delay of one line. As a result, the values of the pixels of the input image necessary for calculating the 3×3 space filter are stored in different shift registers for the individual lines. FIG. 2B shows the status in which the values of the nine pixels of the input image around F22 are stored in the shift registers. The values of the nine pixels stored in the shift registers are sequentially inputted to the processing circuits PE1, PE2 and PE3 so that their products with the corresponding coefficients are calculated. The resultant products are inputted to the linkage units LU1 and LU2 and are added so that the value of R22 is determined in this case. Thus, in the semiconductor integrated circuit of the prior art shown in FIGS. 2A and 2B, the values of the pixels over the three lines are inputted to the three processing circuits by making use of the delays of the line memories so that the three multiplications are processed in parallel. As a result, the space filter can be processed at a high speed. The aforementioned citation has reported that the BiCMOS device prepared for trial by the working technique of 1.8 microns could process the calculations of the 3×3 space filter on real time for the TV image composed of 512×512 pixels.

A first object to be achieved by the present invention is to provide a semiconductor integrated circuit for performing the processing operations using two-dimensional data in high parallelism, and a second problem is to integrate such a plurality of processing circuits in a high integration over a semiconductor chip as execute the processing operations in high parallelism by using a two-dimensional memory cell array capable of massive two-dimensional data and the two-dimensional data.

In the semiconductor integrated circuit of the prior art shown in FIGS. 2A and 2B, as has been described above, the calculations of the space filter are executed at a high speed by the nine multiplications necessary for calculating one output pixel, three by three in parallel. For the future, however, the parallelism has to be enhanced to increase the speed.

As the quality of the image of a TV set, a workstation, a personal computer or a game machine advances to the higher level, the number of pixels of one frame increases so that the frequency of the pixels is increased to the higher range. Moreover, it is anticipated that the portable devices having the communications and displaying functions are widely used in the near future. It is also anticipated that such device has to effect a clear displaying by variously processing the data of the moving image received by the communications function. In this device, a battery having a low voltage is mounted as a power source to drive the device. Generally speaking, however, the speed of the semiconductor integrated circuit drops substantially proportionally to the drop of the supply voltage so that the semiconductor integrated circuit of the prior art may be unable to achieve a sufficient processing speed. In order to solve this, the parallelism has to be raised to prevent the drop in the processing speed. It is therefore desired to provide a semiconductor integrated circuit which has a higher parallelism and which can process two-dimensional data at a high speed.

In the device for handling an image, moreover, here is used the so-called "image memory" for storing the data of at least one display so as to simultaneously perform the formation and processing of an image by the CPU and the drawing of the image in the CRT. It is contributable to the reduction of the size of a device for handing an image, especially a portable device to integrate the device, which executes the processing operations of the image memory and the two-dimensional data in high parallel, in a common semiconductor chip.

According to a representative embodiment of the present invention, a semiconductor integrated circuit comprises: a memory cell array (MAR) including a plurality of data lines (DG), a plurality of word lines (W1 to W3) intersecting the plurality of data lines (DG), and a plurality of memory cells disposed at desired intersections between the plurality of data lines (DG) and the plurality of word lines CW1 to W3); a parallel data transfer circuit (TRC) for transferring a plurality of data in parallel from the plurality of data lines (DG); and a plurality of processing circuits (PE1 to PEn) for receiving the plurality of data transferred from the parallel data transfer circuit (TRC), as their input signals. Thus, the present invention is characterized in that the parallel data transfer circuit (TRC) is enabled to transfer two or more of the plurality of data to the individual ones of the plurality of processing circuits (PE1 to PEn) by sequentially selecting and selecting two or more of the plurality of data lines (DG) with the individual ones of the plurality of processing circuits (PE1 to PEn); and in that the adjoining ones of the plurality of processing circuits (PE1 to PEn) can input the same data from the same data lines.

Since the ranges of the data lines of the two-dimensional memory arrays for the adjoining processing circuits to make access to are overlapped, it is possible to execute a filter processing operation of an image by calculating the value of a pixel from the value of a pixel neighboring the former pixel. In the 3×3 filter, for example, the two-dimensionally distributed surrounding 3×3 input pixels are required for achieving the result of one output pixel, and the filter processing operation in the line direction can be executed by inputting the adjoining pixels on the same line to one processing circuit. If, moreover, the processing circuit is designed to execute the processing operation by the use of a plurality of data groups read out to one of the aforementioned plurality of data line groups by selecting two or more of a plurality of word lines, the filter processing operation can be executed by inputting that one of the 3×3 input pixels, which is perpendicular to the line direction, to one processing circuit. As a result, the filter processing operation can be executed by inputting the 3×3 pixels to one processing circuit. Since, moreover, the adjoining processing circuits have an overlap of the ranges of the data lines to which they can make access through the parallel data transfer circuit, the convolution processing operation and the processing operation using the two-dimensional data of the 3×3 filter or the like can be processed in parallel by the plurality of processing circuits.

BRIEF DESCRIPTION OF THE DRAWINGS

FIG. 1 is an embodiment showing the construction (i.e., the 3×3 space filter) of a semiconductor integrated circuit according to the present invention.

FIGS. 2A and 2B show a semiconductor integrated circuit of the prior art using a line memory.

FIGS. 5A and 5B are an embodiment showing the construction of a parallel data transfer circuit in the embodiment of FIG. 4.

FIGS. 8A and 8B are an embodiment showing the construction of a parallel data transfer circuit in the embodiment of FIG. 7.

DETAILED DESCRIPTION OF THE INVENTION

Figure 3:
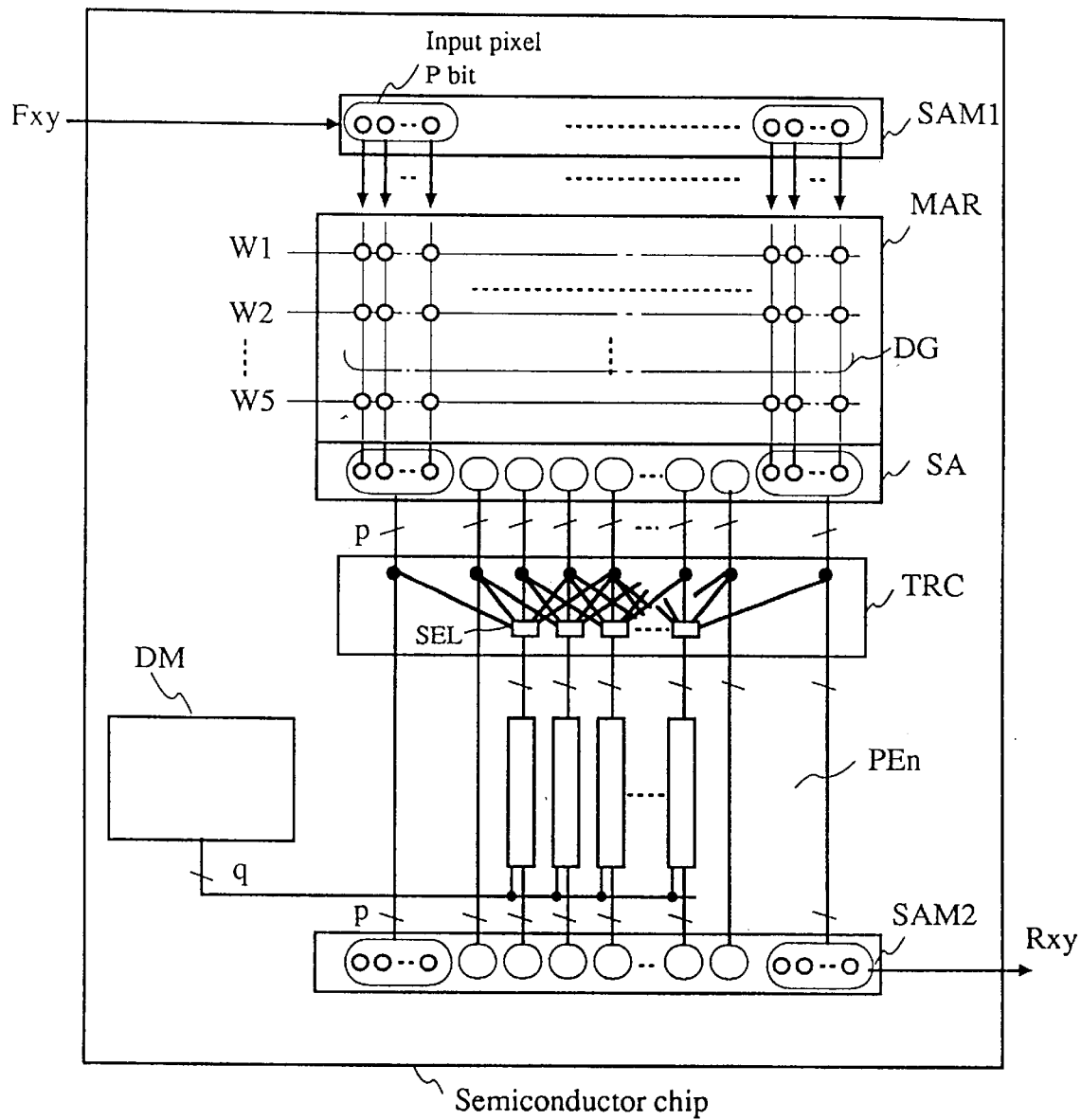
FIG. 3 is an embodiment showing the construction (i.e., the 5×5 space filter) of a semiconductor integrated circuit according to the present invention.

FIG. 1 shows an embodiment of a semiconductor device according to the present invention, that is, a construction of a device for processing the image data, which are inputted on real time, with a 3×3 space filter. In FIG. 1, there are shown not only the construction of the present embodiment but also the correspondences between the pixels of an image frame and the contents of memory cells in the device as well as a method of controlling a parallel data transfer circuit. According to the present embodiment, the space filters of one line of the frame of an output image can be processed in parallel. The present embodiment is constructed, as shown, to comprise: a serial access memory SAM1 for storing input pixels Fxy of one line and writing them in parallel in a two-dimensional memory array MAR; the two-dimensional memory array MAR for storing the values of the pixels of three lines, which are outputted from the serial access memory SAM1; a sense amplifier SA for reading the values of the pixels of one line of the two-dimensional memory array MAR in parallel and latching them; a parallel data transfer circuit TRC for transferring the read values in parallel to a processing circuit group; a data memory DM for storing a filter coefficient; and the grouped processing circuits PE1, PE2, - - -, and PEn for multiplying/summing operations in parallel. The operations of the present embodiment will be described in the following with reference to FIG. 1.

First of all, the input images composed of data of P bits are serially inputted to the serial access memory SAM1. The input images are written, when the pixel values F11, F12, - - -, and Flk of their first line are stored, in parallel in a word line W1 of the two-dimensional memory array MAR. Subsequently, the pixel values of the second and third lines of the input images are likewise written in word lines W2 and W3 each time they are stored in the serial access memory SAM1. Now, the data of the three lines necessary for calculating the pixel values of the frame of the output image are prepared in the two-dimensional memory array MAR. At this time, the correspondences between the frame of the input image and the data on the word lines of the two-dimensional memory array MAR are shown at the lower lefthand of FIG. 1.

While the data of the next line are being written in the serial access memory SAM1, the values R11, R12, - - -, and R1k of the pixels of the second line of the frame of the output image are calculated in parallel. At this time, the control of the parallel data transfer circuit is executed by nine processing cycles, as shown at the lower righthand of FIG. 1. First of all, in the first cycle, the input images of one line, which are stored in the word line W of the two-dimensional memory array MAR, are read out and are latched through a data line group DG in the sense amplifier SA. Here is turned ON one L of the switches L, C and R of a selector SEL composing the parallel data transfer circuit TRC. As a result, there are transferred through the parallel data transfer circuit TRC the input pixel Fil to the processing circuit PE1, the input pixel F12 to the processing circuit PE2, - -, and the input pixel Flk-2 to the processing circuit PEn. Simultaneously with this, a weighting coefficient C-1-1 is read out from the data memory DM and is multiplied by the input pixel which is inputted to the processing circuit. Subsequently, in the second cycle, the switch C in the selector SEL is turned ON to input through the parallel data transfer circuit the input pixel F12 to the processing circuit PEl, the input pixel Fl3 to the processing circuit PE2, , and the input pixel F1k-1 to the processing circuit PEn, and these input pixels are multiplied by the weighting coefficient C-10. In the third cycle, the switch R in the selector SEL is turned ON to likewise input through the parallel data transfer circuit the input pixel F13 to the processing circuit PE1, the input pixel F14 to the processing circuit PE2, - - -, and the input pixel F1k to the processing circuit PEn, and these input pixels are multiplied by the weighting coefficient C-11. After the input images stored in the word line W1 of the two-dimensional memory array MAR have thus been used, the word line W2 is then selected to read out and latch the input images of one line in the sense amplifier. In the fourth cycle, moreover, the switch L in the selector SEL is turned ON to transfer the input pixel F21 to the processing circuit PE1, the input pixel F22 to the processing circuit PE2, - - -, and the input pixel F2k-2 to the processing circuit PEn. These input pixels are multiplied by a weighting coefficient CO-1, and the products are added to the previously calculated values. Subsequently, in the fifth cycle, the switch C in the selector SEL is turned ON to input the input pixel F22 to the processing circuit PEl, the input pixel F23 to the processing circuit PE2, - - -, and the input pixel F2k-1 to the processing circuit PEn. These input pixels are multiplied by the weighting coefficient C00, and the products are added to the previously calculated values. Likewise, in the sixth cycle, the switch R in the selector SEL is turned ON to input the input pixel F23 to the processing circuit PE1, the input pixel F24 to the processing circuit PE2, - - -, and the input pixel F2k to the processing circuit PEn. These input pixels are multiplied by the weighting coefficient C01, and the products are added to the previously calculated values. If, moreover, similar calculations are executed in the seventh to ninth cycles by selecting the word line W3, the values R22, R23, - - -, and R2k1 of the pixels of the second line of the output frame are determined at the processing circuits PE1, PE2, - - -, and PEn. These pixel values R22, R23, - - -, and R2k-1 are transferred in parallel to the serial access memory SAM2 and are sequentially outputted. Incidentally,-the terminal pixel has no necessary input pixel and may be transferred as it is, as shown. In order to process of the output images of the subsequent one line, similar operations may be repeated. Specifically, when the pixel information of one line is stored in the serial access memory SAM1, it is transferred to that word line of the two-dimensional memory array, which was rewritten at the most preceding time, so that the output image of one line is processed while the pixel information of the subsequent line is being written in the serial access memory SAM1. Thus, according to the present embodiment, the 3×3 space filter processing operations of a plurality of images on the same line of the output frame can be processed in parallel and on real time. The individual processing circuits may complete the processing operations and the data transfers for the time period in which the images of one line are inputted. As a result, the time period to be used for the processing operations is elongated more than that of the prior art, in which the processing operation is carried out for each time period in which one pixel is inputted. In other words, the real time processing operation can be accomplished even in case the input pixels have a high frequency.

As described above, moreover, the present embodiment can transfer the information, which is latched in one sense amplifier, to different processing circuits through the parallel data transfer circuit TRC. As a result, the two-dimensional filter or the convolution processing operation can be executed in parallel without moving or transferring the data latched in the sense amplifier during the processing operation between the sense amplifiers or between the processing circuits. As a result, no excessive circuit is required for the transferring operations between the sense amplifiers or between the processing circuits, so that a highly integrated low power consumption can be realized. In the present embodiment, as shown in FIG. 1, the processing circuits are arranged just be low the two-dimensional memory array MAR. As a result, the data transfer distance from the two-dimensional memory array to the processing circuits can be reduced to a very short constant distance. As a result, in addition to an advantage that the delay time period for the transfer is short, there can be attained another advantage that the processing circuits are less dispersed inbetween so that they can be easily synchronized. Since, moreover, the parallel data transfer circuit and the processing circuits are arranged adjacent to and just below the memory array, they can be highly integrated to suppress the power consumption accompanying the transfer of the pixel information.

The embodiment of FIG. 1 was directed to a device for the 3×3 filter calculations. In the parallel data transfer circuit, therefore, one processing circuit and the data lines for three pixels are connected, and the sense amplifier and the processing circuits are connected with an overlap of two pixels between the adjoining processing circuits. As could be understood, in the embodiment of FIG. 1, the processing operation of a filter having an arbitrary size of 3×3 or more can be accomplished by changing the construction of the parallel data transfer circuit and the memory array. FIG. 3 shows an embodiment exemplifying a construction of the processing device capable of processing of a 5×5 filter. The present embodiment is modified from the embodiment of FIG. 1 such that the number of the word lines of the two-dimensional memory array MAR is increased to five and such that the overlap of the parallel data transfer circuit TRC is increased to four pixels. The selector SEL composing the parallel data transfer circuit TRC is exemplified of a 5:1 selector for selecting data of P bits from the data of 5P bits, and twenty five coefficients necessary for the 5×5 filters can be stored by increasing the capacitance of the data memory. In the present embodiment, one processing circuit can fetch the data from the sense amplifier corresponding to the five pixels, and the adjoining processing circuits share the data lines of four pixels of the data line group. As a result, the processing operations of the 5×5 filters can be executed in parallel while selecting the word lines of the two-dimensional memory array sequentially as in the embodiment of FIG. 1. Incidentally, in the present embodiment, not only the processing operation of the 5×5 filter can be executed, but also a 4×4 filter can be easily constructed, as could be easily understood, by using four of the five word lines and four of the five sets of wiring lines connected with one transfer circuit TRC. Likewise, it is possible to execute the processing operation of a 3×3 filter or a 2×2 filter.

In the embodiments of FIGS. 1 and 3, one processing circuit may be arranged for P data liens if the value of the pixel is expressed by P bits. In case the pixel value is expressed in the accuracy of 8 bits, for example, the processing circuits may be arranged within the pitch of the eight data lines. It may, however, be difficult to arrange the processing circuits in case the processing circuits have a large scale or in case the data lines of the two-dimensional memory array has a narrow pitch.

Figure 4:
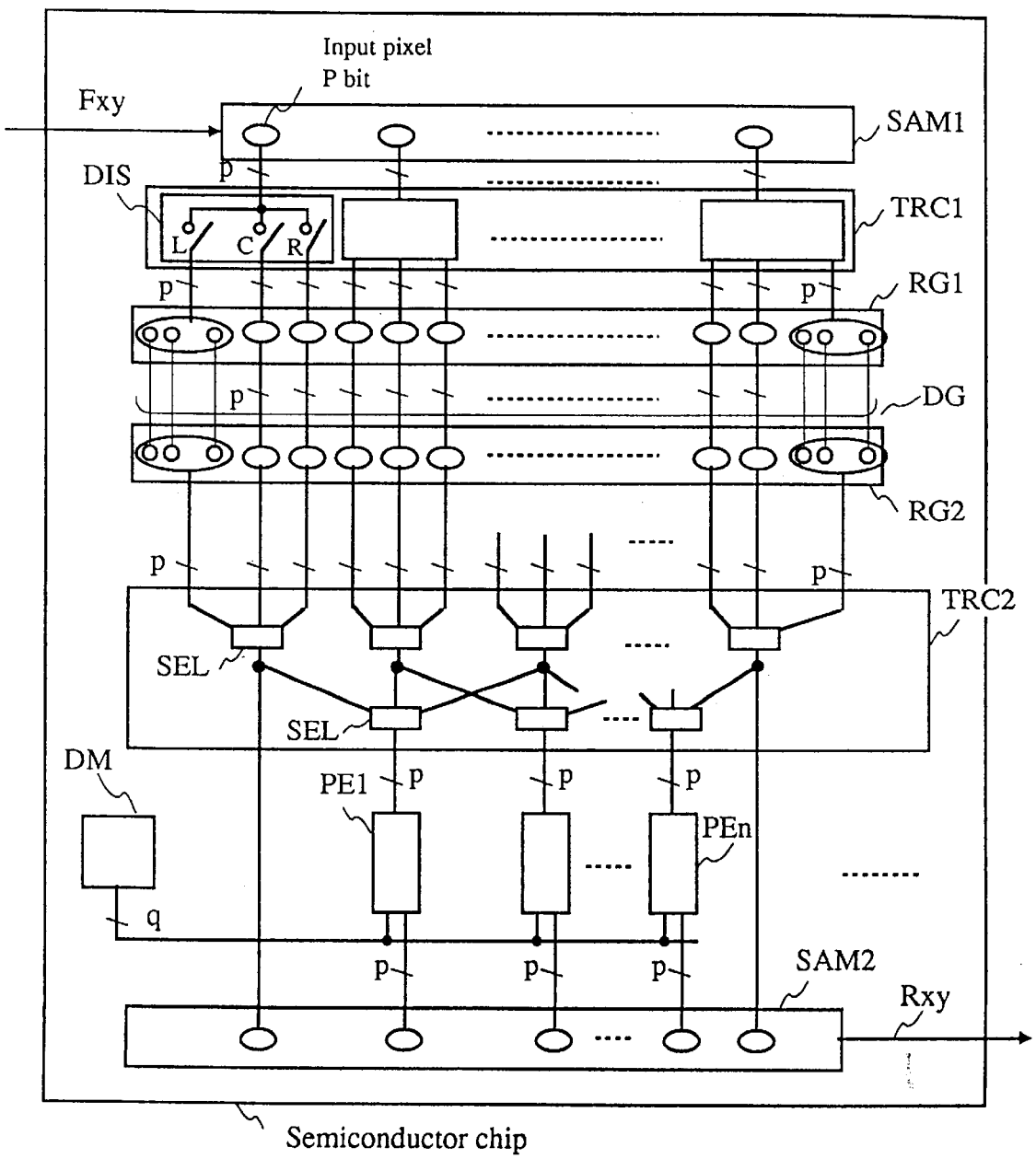
FIG. 4 is an embodiment showing a first construction for loosening the layout pitch of the processing circuit in the embodiment of FIG. 1.

In this case, there can be used an embodiment shown in FIG. 4. FIG. 4 presents one embodiment for loosening the layout pitch of the processing circuits more in the device of FIG. 1 for calculating the 3×3 filter. In the present embodiment, the input images of one line, which are inputted to the serial access memory SAM1, are transferred through the parallel data transfer circuit TRC1 composed of distributors DIS to a register RG1 having having a capacitance of three lines. As a result, the layout pitch of the processing circuit is three times as large as that of the embodiment of FIG. 1. In the embodiment of FIG. 1, one processing circuit can transfer the data from the data lines of three pixels, and the two transfer paths are overlapped in the adjoining processing circuits. In the present embodiment, on the contrary, one processing circuit can transfer data from the data lines of nine pixels, and the parallel data transfer circuit is constructed such that six data lines are shared between the adjoining processing circuits. The operations of the present embodiment will be described in the following with reference to FIG. 4.

First of all, when the input images of the first line are stored in the serial access memory SAM1, the switches L in all the distributors DIS are turned ON to write the input images in parallel in the register RG1. When the input images of the second line are then stored in the serial access memory SAM1, the switches C in all the distributors DIS are turned ON to write the input images in parallel in the register RG1. When the input images of the third line are then stored in the serial access memory SAM1, the switches R in all the distributors DIS are turned ON to write the input images in parallel in the register RG1. The images of the consecutive first, second and third lines, as thus written in the register RG1, are transferred in parallel from the register RG1 through the data line group DG to the register RG2. Then, there are prepared in the register RG2 the pixels of the input images for the three lines necessary for processing the output images of the second line. These data are transferred through the parallel data transfer circuit TRC2 to the processing circuit so that the values of the pixels of the second line of the output images are determined. Incidentally, the transfers and processing operations of the data have to be executed while the input images of the fourth line are being written in the serial access memory SAM1. When the calculations of the pixel values of the second line of the output images are completed so that the input images of the fourth line are written in the serial access memory SAM1, the switch L of the distributor DIS is turned ON to rewrite one third of the content of the register RG1. Since, at this time, the images of the second, third and fourth lines of the input images are prepared in the register RG1, they are transferred in parallel from the register RG1 to the register RG2 to execute the processing operations of the output images of the third line. If these operations are continued each time the input images of one line are stored in the serial access memory SAM1, the processing operations of the 3×3 filter can be continuously executed in parallel. Incidentally, as to the aforementioned operations, how the processing operations are executed by sending the data from the register RG2 to the processing circuits will be described with reference to FIGS. 5A, 5B and 6.

Figure 6:
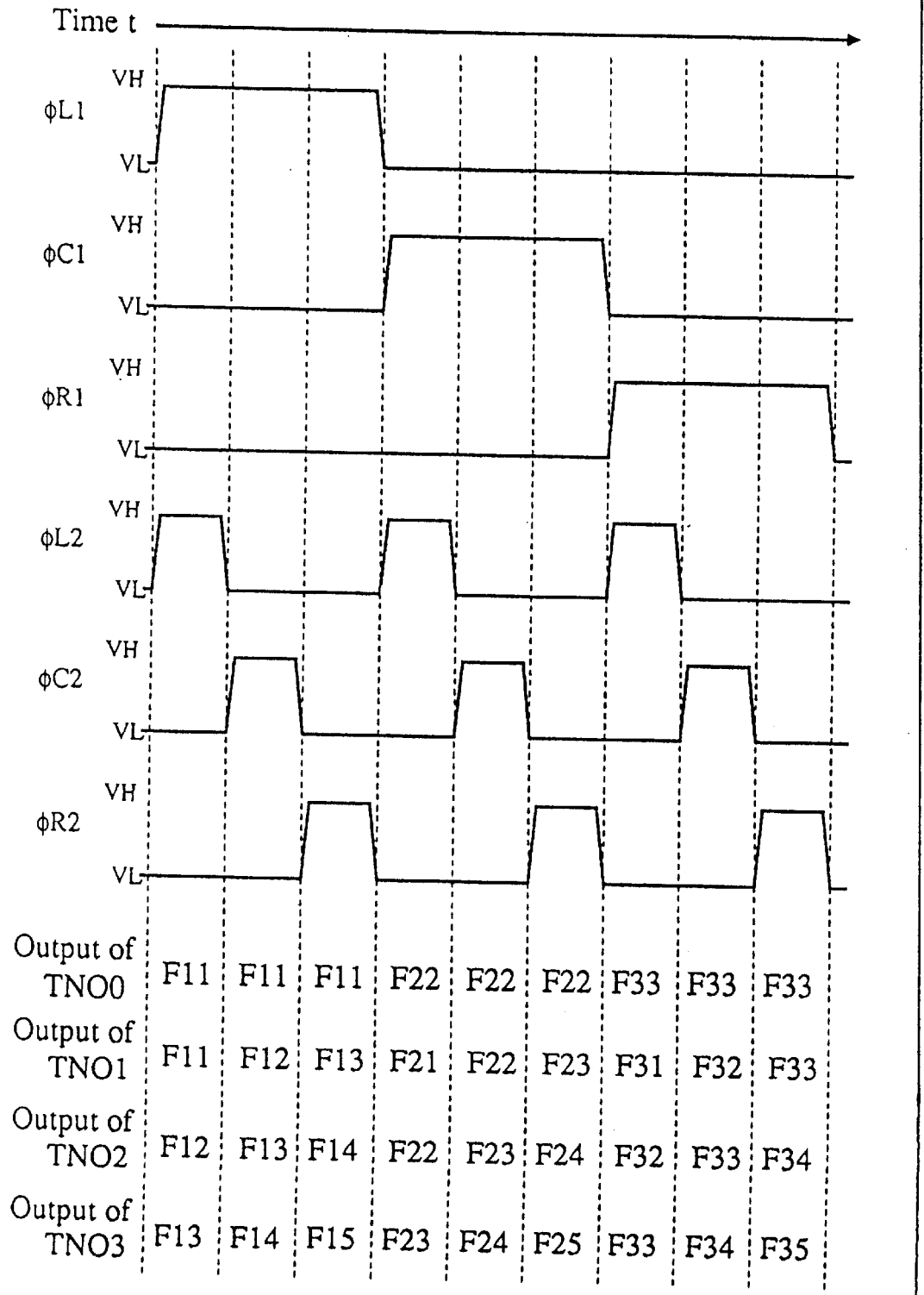
FIG. 6 is an embodiment showing a method of controlling the parallel data transfer circuit in the embodiment of FIGS. 4 and 5.

FIGS. 5A and 5B show an example of the construction of the parallel data transfer circuit TRC2 for the embodiment of FIG. 4. As shown in FIG. 5A, the parallel data transfer circuit TRC2 has its selectors SEL connected in two layers and individually fed with three control signals $\phi Li$, $\phi Ci$ and $\phi Ri$. The selector is composed of three switches L, C and R, as shown at the lefthand side of FIG. 5B. When the switch L is turned ON by the control signal $\phi Li$, a lefthand input signal INL is outputted; when the switch C is turned ON by the control signal $\phi Ci$, a central input signal INC is outputted; and when the switch R is turned ON by the control signal $\phi Ri$, a righthand input signal INR is outputted. These switches can be constructed by connecting MOS transistors in parallel, as shown at the righthand side of FIG. 5B. FIG. 5A shows the state, in which the input images of the first, second and third lines are transferred to the register RG2. In this state, as described above, the pixel data for processing the output images of the second line in parallel have to be transferred to the processing circuit. FIG. 6 illustrate the timings of the control signals for that necessity. In FIG. 6, letters $\phi L1$, $\phi C1$ and $\phi R1$, and $\phi L2$, $\phi C2$ and $\phi R2$ designate the control signals of the selector SEL composing the parallel data transfer circuit TRC2. FIG. 6 also shows which pixel data are outputted to the lefthand four outputs TNO0, TNO1, TNO2 and TNO3 of the outputs of the parallel data transfer circuit TRC2 are outputted at the individual times. With the processing circuit PE1, as shown in FIG. 5A, there is connected the output TNO1 of the parallel data transfer circuit TRC. As a result, it is found from FIG. 6 that the pixels. F11, F12, F13, F21, F22, - - -, and so on and the 3×3 pixel data around the pixel F22 are inputted to the processing circuit PE1. Likewise, the 3×3 pixel data around the pixel F23 are inputted to the processing circuit PE2, and the 3×3 pixel data around the pixel F24 are inputted to the processing circuit PE3. As a result, the output images of the two lines can be processed in parallel by the processing circuits PE1, PE2, PE3, - - -, and so on. The processing operations of the output images on the third and later lines can be likewise carried out. Incidentally, the 3×3 filter cannot be processed as to the lefthand end TNO0 so that the output is made not through the processing circuit but as it is, as in FIG. 1. According to the embodiment shown in FIGS. 4, 5A, 5B and 6, as described above, the layout pitch of the processing circuits are loosened, and the two-dimensional filter operations can be executed in parallel for each lien of the output images. Incidentally, here is exemplified the 3×3 filter, the present invention can be easily expanded to the processing operations of a larger filter.

Figure 7:
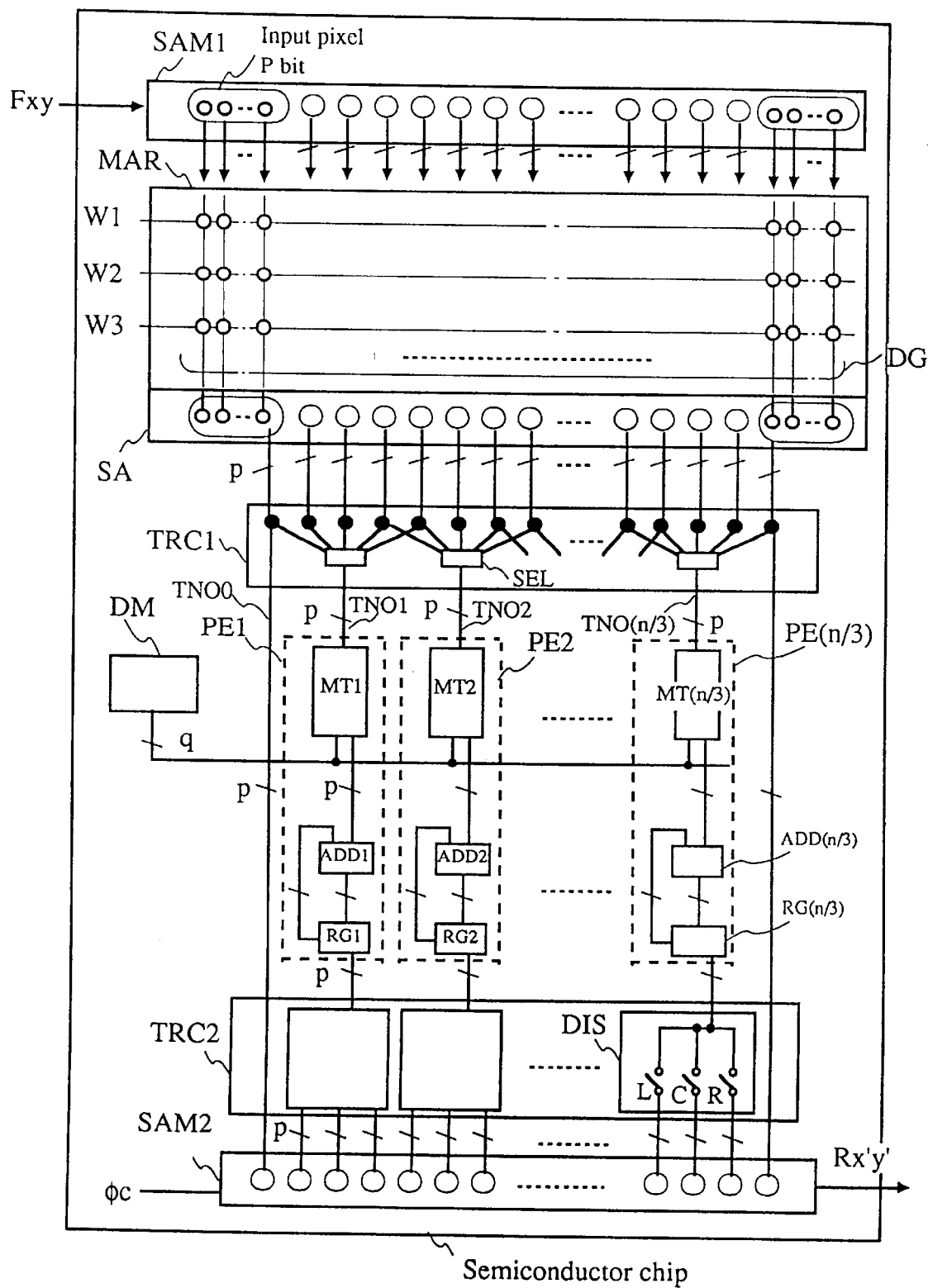
FIG. 7 is a second embodiment showing the construction for loosening the layout pitch of the processing circuit in the embodiment FIG. 1.

FIG. 7 shows a second embodiment for loosen the layout pitch of the processing circuit more than that of the device of FIG. 1 for calculating the 3×3 filter. In FIG. 4, the loose layout pitch is realized by arranging the same number of processing circuits as that of the device of FIG. 1 over a layout width of three times. In the present embodiment, on the contrary, the layout pitch is loosened by reducing the number of processing circuits to one third and by arranging the processing circuits within the same layout width as that of the embodiment of FIG. 1. FIGS. 8A and 8B show an example of the construction of the parallel data transfer circuit TRC1 for the embodiment of FIG. 7. FIG. 8A shows the state in which the pixel values F11, F12, - - -, and so on of the first line of the input images are transferred to the sense amplifier SA. The parallel data transfer circuit TRC1 is constructed of a kind of 5:1 selector SEL for selecting P bits from 5P bits, as shown in FIG. 7. FIG. 8A shows an embodiment in which the selector SEL of FIG. 7 is composed of a kind of 2:2 selector SEL2-1 for selecting P bits from 2P bits. The selectors are connected in three layers, and each selector SEL2-1 is fed with the two control signals φLi and φRi. The selector SEL2-1 is composed of the two switches L and R, as shown at the lefthand side of FIG. 8B. The lefthand input signal INL is outputted when the switch L is turned ON by the control signal φLi, and the righthand input signal INR is outputted when the switch R is turned ON by the control signal φRi. These switches can be constructed by connecting the MOS transistors in parallel, as shown at the righthand side of FIG. 8B.

Figure 9:
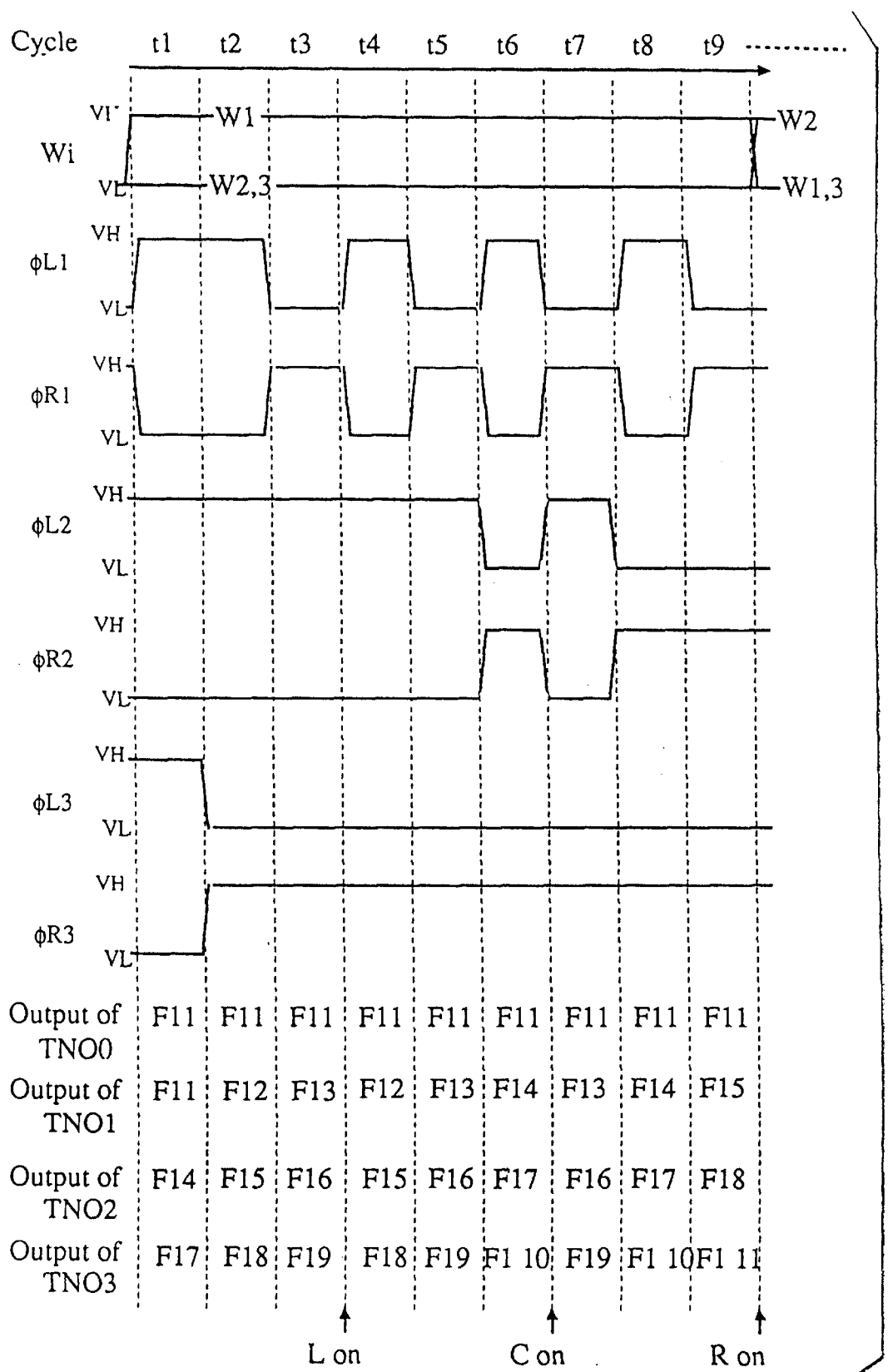
FIG. 9 is an embodiment showing a method of controlling the parallel data transfer circuit in the embodiment of FIGS. 7 and 8.

The operations of the embodiment shown in FIGS. 7 8A and 8B will be described in the following with reference to FIG. 9. In FIG. 9, (φL1, φR1), φL2, φR2) and (φL3, φR3) designate the individual control signals for the selectors SEL composing the parallel data transfer circuit TRC1 shown in FIGS. 8A and 8B. FIG. 9 illustrate the timings of the selections of the word lines and the aforementioned control signals, the pixel data to be outputted from the lefthand four TNO0, TNO1, TNO2 and TNO3 of the outputs of the parallel data transfer circuit TRC1, and the timings for turning ON the switches L, C and R of the distributor DIS in the parallel data transfer circuit TRC2. In the present embodiment, since the number of the processing circuits is reduced to one third, the three consecutive output pixels are processed by one processing circuit. First of all, the input images of the first line are stored in the serial access memory SAM1 and are then transferred to the word line W1 of the two-dimensional memory array MAR. Likewise, the input images of the second and third lines are transferred to the word lines W2 and W3, and the output images of the second line are then started. The input images of the first line on the word line W1 are read out through the data line group DG, and their pixels F11, F12, F13, - - -, and so on are latched from the lefthand in the sense amplifier, as shown in FIG. 8A. After this, the control signal of the selector SEL in the parallel data transfer circuit TRC1 are switched, as indicated in the column of a cycle t1 of FIG. 9. Then, the pixels F11, F14, F17, - - -, and so on are respectively transferred through the outputs TNO1, TNO2 and TNO3 of the parallel data transfer circuit TRC to the processing circuits PE1, PE2 and PE3. As a result, the pixels are multiplied in the multipliers MT1, MT2, - - -, and so on by the weighting coefficients read out from the data memory, and the resultant products are stored in the registers RG1, RG2, - - -, and so on. Subsequently, the control signals of the selector SEL are switched, as indicated at the column of a cycle t2 in FIG. 9. Then, the pixels F12, F15, F18, - - -, and so on are respectively transferred to the processing circuits PE1, PE2 and PE3. These data are multiplied by the weighting coefficients. The products are added to the preceding result stored in the registers, and the sums are stored again in the registers. As indicated at the column of a cycle t3 in FIG. 9, moreover, the control signals are switched to transfer the pixels F13, F16, F19, - - -, and so on respectively to the processing circuits PE1, PE2 and PE3. These data are multiplied and added to the preceding results. The results thus far made are written in the serial access memory SAM2 through the switch L of the distributor DIS in the parallel data transfer circuit TRC2 of FIG. 7. The data are intermittently written in the serial access memory SAM2.

Next, while the input pixels of the first line are being latched in the sense amplifiers, the data are transferred, as indicated at cycles t4 to t6 in FIG. 9, and the processed results are intermittently written in the serial access memory SAM2 by turning the switch C of the distributor DIS.

Subsequently, while the input pixels of the first line being latched in the sense amplifier, the data are transferred, as indicated at cycles t7 to t9 in FIG. 9, and the processed results are intermittently written in the serial access memory SAM2 by turning the switch R of the distributor DIS. After this, the word line W2 is selected to latch the input pixels of the second line in the sense amplifier, and similar processing operations are carried out. Here, at the starts of the cycles t1, t4 and t7; the results obtained by using the input pixels of the first line are fetched from the serial access memory SAM2 in the registers RG1, RG2, - - -, and so on shown in FIG. 7, and the newly obtained multiplied results are added to the fetched results. When similar operations are executed by selecting the word line W3 to latch the input pixels of the third line in the sense amplifier, all the values of the pixels of the output images of the second line are determined in the serial access memory SAM2. If these operations are continued each time when the input pixels of one line are stored in the serial access memory SAM1, the processing operations of the 3×3 filter can be continuously carried out. Like the embodiment of FIG. 4, the present embodiment can achieve an advantage that the layout pitch of the processing circuit can be made three times as large as that of the embodiment of FIG. 1. The present embodiment can reduce the number of processing circuits to one third, because one processing circuit performs the processing operations of three consecutive output pixels, so that it is suitable for the case in which many processing circuits cannot be integrated over one chip. Incidentally, in order to loosen the pitch of the processing circuit more, it is sufficient that one processing circuit process three or more consecutive pixels, as could be easily understood. For this, as could also be easily understood, the transfer network may be so constructed that the data can be transferred to one processing circuit from the numerous sense amplifiers while leaving two transfer paths overlapped in the adjoining processing circuits.

The embodiments thus far described with reference to Figures including FIG. 9 exemplify the two-dimensional linear filter. Thanks to these embodiments, the lines or edges in the image can be fast emphasized or smoothed by changing the sizes and coefficients of the filters. By changing the functions of the processing circuit, moreover, the extraction of a specific pattern or the processing operations of a non-linear filter such as a median filter can be executed at a high speed. Moreover, the foregoing embodiments can naturally be utilized, if they process the outputs by using the information of neighboring cells two-dimensionally distributed, for processing a cellular automaton or a neural network coupled to the neighboring neuron only. Incidentally, in the Figures for describing the aforementioned embodiments, the two-dimensional memory cell array is made to store only the data of the pixels of the number of lines necessary for the processing operations. By increasing the number of the word lines of the two-dimensional memory array, however, it is easy to store the pixel data of more lines. If the data of one frame are to be stored, for example, the embodiments can also be used as the so-called "frame memory". In this case, only a portion of the two-dimensional memory array is processed, whereas the remaining data are serially read out and outputted as they are so that only a portion of the screen can be processed by the filter or the like. Still moreover, the area to be processed can be easily moved merely by changing the control of the word lines.

Figure 10:
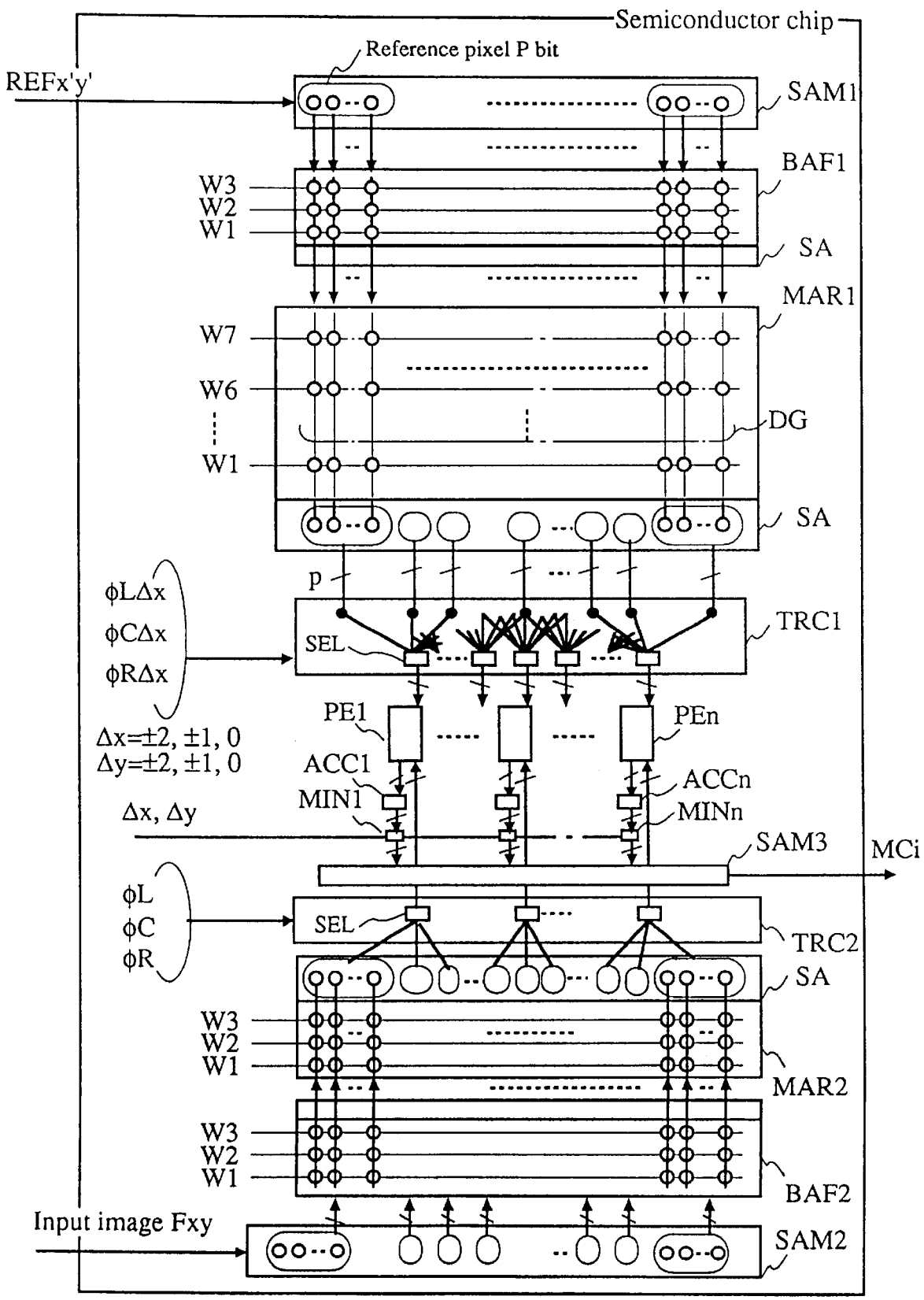
FIG. 10 is an embodiment showing the construction of a moving vector processing circuit using the present invention.
Figure 11:
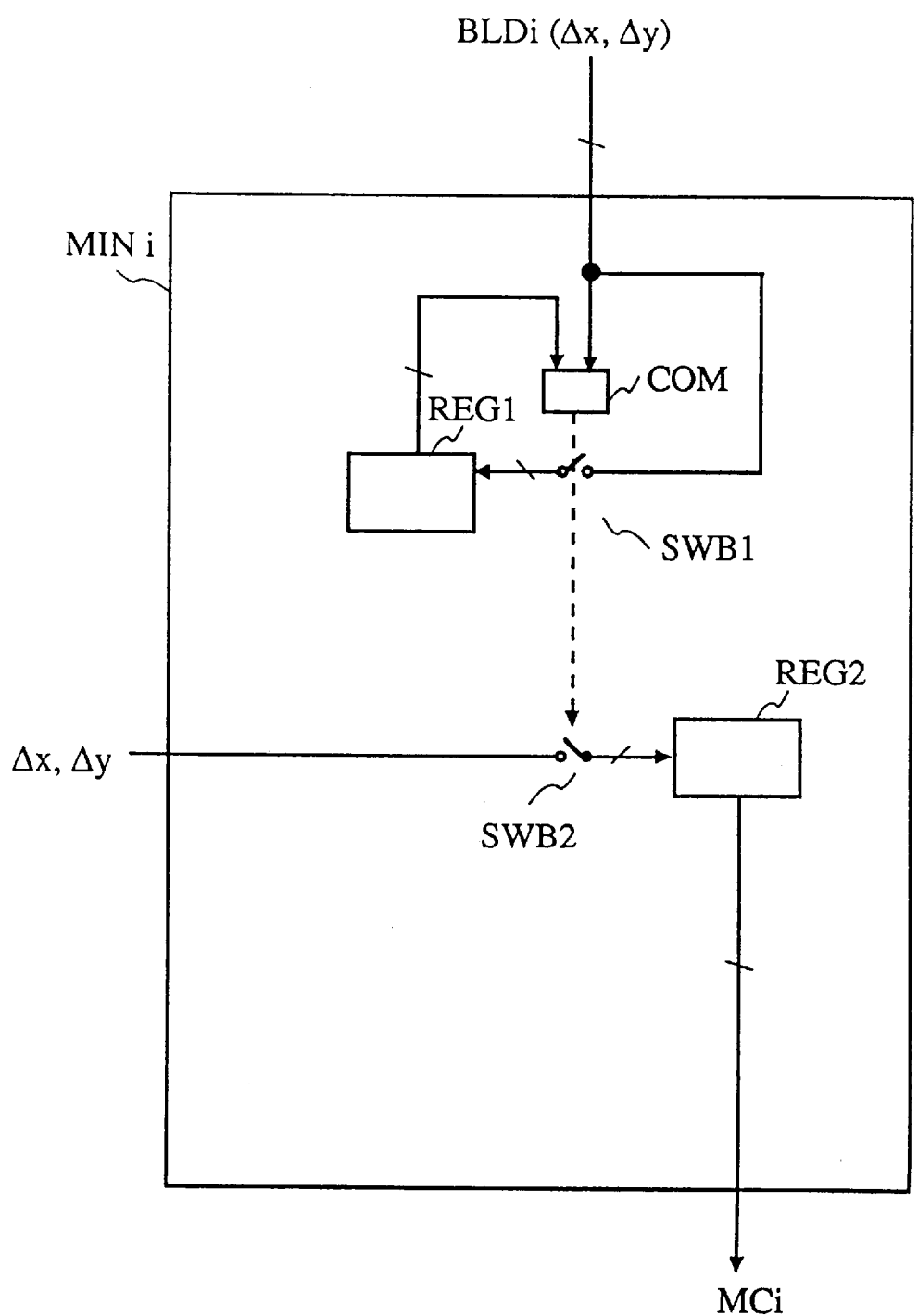
FIG. 11 is an embodiment showing the construction of a minimum distance processing circuit in the embodiment of FIG. 10.

Here will be described an embodiment for detecting a moving vector as an example, in which the present invention is applied to another other than the filter. The detection of the moving vector is useful for the compressing/uncompressing a digital moving image. Because of a large amount to be processed, however, there is desired a device for detecting the moving vector at a high speed. As well known in the art, the moving vector is detected by dividing the input image into blocks composed of a plurality of pixels, by comparing the individual blocks between a block positioned to correspond to a reference image and a plurality of blocks positioned in the neighborhood of the former to determine a block having the shortest distance, and by determining the coordinate difference from the block of the input image, FIGS. 10 and 11 show an embodiment of a device for processing the moving vector of a moving image by applying the present invention. In order to simplify the description, it is assumed in the following that the block has a size of 3×3 pixels and that the search has a scope of two pixels in the vertical and horizontal directions. However, the present embodiment should not be limited to those numerical values but can be easily expanded. FIG. 11 shows a construction of a minimum distance processing unit for determining the minimum of an inter-block distance, as determined in FIG. 10, to output the moving vector. Here will be described the construction and operations of the present embodiment.

In the device of FIG. 10, a pixel REFx y of a reference image to be used for comparison with the pixel Fxy of the input image is individually inputted on real time to the serial access memories SAM2 and SAM1. After having been inputted to the serial access memories, the pixel is transferred to two-dimensional buffer arrays BAF2 and BAF1 for three lines and further to the two-dimensional memory arrays MAR2 and MAR1 for the comparison. The two-dimensional memory array MAR2 can store the input images of three lines so that a block having a size of 3×3 pixels can be stored in one column. On the other hand, the two-dimensional memory array MAR1 can store input images of seven lines which include the vertical two lines in addition to the position corresponding to the block of the input images in the memory array MAR2. Incidentally, the input images to be inputted to the serial access memory SAM2 are inputted with a delay of two lines from the reference image inputted to the access memory SAM1, so that the data are transferred from the access memories SAM1 and SAM2 respectively to the buffer arrays BAP1 and BAF2 and the memory arrays MAR1 and MAR2 each time when the data of one line are stored. As a result, the image in the memory array MAR1 has the vertical two lines in addition to the position corresponding to the block of the input image in the memory array MAR2. The two-dimensional buffer arrays BAF2 and BAF1 of three lines are provided for temporarily storing the data for determining the moving vector of the block of a next column while the moving vector of the block of one column is being determined. At the end of each processing operation of the moving vector of the block of one column, the data of those two-dimensional buffer arrays BAF1 and BAF2 are transferred to the memory arrays MAR1 and MAR2 so that the moving vector of the block of the next one column is processed. In order to determine the moving vector, as described above, it is necessary to calculate the distance between the block of the input image and the block of the reference image which is positionally shifted in the vertical and horizontal directions. The inter-block distance can be determined by summing the differences between the values of the pixels composing one block and the pixels composing another block. In the embodiment of FIG. 10, the distances between the pixels read out from the memory arrays MAR2 and MAR1 are calculated in parallel by the processing circuits PE1, - - -, and PEn. If the control signals φL, φC and φR of the parallel data transfer circuit TRC2 are switched each time when the word lines of the memory array MAR2 are selected one by one, it is possible to transfer the pixels of different blocks for the processing circuits. On the other hand, the memory array MAR1 has the data of the reference image in excess of vertical two lines in addition to the position corresponding to the block of the input image in the memory array MAR2. By switching the word lines, therefore, the y coordinate of the pixels to be transferred can be changed within th vertical two pixels in addition to the position corresponding to the block of the input image. By switching the control signals of the parallel data transfer circuit TRC1, moreover, the pixels, which are also displaced in the x direction within the range of the totally seven pixels of the horizontal two pixels in addition to the position corresponding to the block of the input image, can be transferred to the individual processing circuits. As a result, the coordinates of the block of the reference image to be inputted to the processing circuits can be shifted within a range of the two pixels in the x and y directions with respect to the input image. Incidentally, the signal lines of the parallel data transfer circuit TRC1 are required to have an overlap of four lines, but the signal lines of the output TN1 need not have any overlap.

The distance between the block of the input image and the block of the reference image is determined in the following manner. First of all, the shift of the coordinates is fixed, and the pixels of the block of the input image and the block of the reference image are transferred to the individual processing circuits PE1, - - -, and PEn. The distances between the pixels, as determined by the processing circuits, are transferred to accumulators ACC1, - - -, and ACCn so that their values for one block are accumulated. The distances between the blocks, as thus determined, are transferred to minimum distance processing units MIN1, - - -, and MINn. These minimum distance processing units determine such a shift of coordinates as minimizes the distances between the blocks. The construction of the minimum distance processing units is shown in FIG. 11. The minimum distance processing unit MINi is constructed, as shown in FIG. 11, to include a comparator COM, registers REG1 and REG2 and switches SWB1 and SWB2. The inter-block distance BLDi (Δx, Δy) for predetermined shifts Δx and Δy is inputted, when determined, to the comparator COM. This comparator COM compares the newly determined inter-block distance BLDi(Δx, Δy) and the inter-block distance (Δx', Δy') of another shifts Δx' and Δy', as already determined and stored in the register REG1. If the result reveals that the distance BLDi (Δx, Δy) is smaller, the switch SWB1 is turned ON to update the content of the register REG1 to the v?alue BLDi(Δx, Δy). The register REG2 is stored with the shift (Δx, Δy), which is also updated to (Δx, Δy) when the switch SWB2 is turned ON. If the distance BLDi (Δx, Δy) is larger, on the contrary, the switches SWB1 and SWB2 are not turned ON so that the contents of the registers are nor updated. By executing the operations described above for all the shifts, the register REG2 determines the shift minimizing the inter-block distance, i.e., a moving vector MC. In FIG. 10, the moving vectors of the blocks of one column are determined in parallel so that they are transferred to the serial access memory SAM3 and sequentially outputted to the outside of the chip.

As has been described hereinbefore, according to the embodiment of FIGS. 10 and 11, it is possible to determine the moving vectors of the blocks of one column in parallel for the image which is inputted on real time. As a result, the moving image compressing/uncompressing system making use of the moving vector is enabled to execute fast processing operations by mounting the semiconductor integrated circuit of the present embodiment on the system. Incidentally, the construction of FIG. 10 can naturally loosen the pitch of the processing circuits by the method of FIGS. 4 and 7.

The embodiments according to the present invention have been described hereinbefore. These embodiments have used the two-dimensional memory arrays which have the word lines capable of storing the pixel data of one or more lines. If the word lines are excessively long, however, the wiring capacitance and resistance may increase to make it difficult to effect a fast drive. In this case, the arrays may be divided. If, however, a simple division is made in that case, the pixels necessary for the processing circuit arranged at the end of the sub-array are present in an adjacent sub-array to make it necessary to provide an access path especially. In order to avoid this, the pixel data at the end of the sub-array may be doubly owned by the adjoining sub-arrays. In the Figures for explaining the embodiments, moreover, the detailed construction of the two-dimensional memories array or the method of producing the control signals is not omitted but can be easily made by the technique used in the ordinary LSI. For example, the two-dimensional memory array can be exemplified by a DRAM array made of a single transistor cell. Since, in this case, the two-dimensional memory array can be constructed in high integration, a larger number of processing circuits can be integrated in the same chip size than that of the construction using a SRAM array or the like. As a result, a faster processing operation can be accomplished. Incidentally, as has been described hereinbefore, most of the embodiments of the present invention use all the information of the memory array for a short time period. As a result, even in case the DRAM array is used, an automatic refreshing is effected during the processing operation. This raises an advantage that the refreshing need not be accomplished by interrupting the processing operation.

According to the semiconductor integrated circuit of the present invention, the processing operations using the two-dimensional data such as the two-dimensional space filter, the convolution processing operation, or the processing operation for searching the moving vector between the images can be executed in parallel. As a result, these processing operations can be executed at a high speed on real time.

What is claimed is:

1. A semiconductor integrated circuit comprising:
   a memory cell array including a plurality of data lines, a plurality of word lines intersecting said plurality of data lines, and a plurality of memory cells disposed at desired intersections between said plurality of data lines and said plurality of word lines;
   a parallel data transfer circuit coupled to first group, second group, and third group data lines of said plurality of data lines; and
   first, second, and third processing circuits coupled to said parallel data transfer circuit respectively,
   wherein said parallel data transfer circuit selects one of said first group, second group, and third group data lines of said plurality of data lines, and
   wherein the adjoining ones of said first, second, and third processing circuits can be coupled to the same group data lines.

2. A semiconductor integrated circuit according to claim 1, wherein each of said first, second, and third processing circuits execute the processing operations by using a plurality of data which are read out to one of said plurality of data lines by selecting two or more of said plurality of word lines.

3. A semiconductor integrated circuit according to claim 2, further comprising: a first serial access memory for storing serial data inputted from the outside and outputting said serial data in parallel to said plurality of data lines; and a second serial access memory for transforming the output data of said plurality of processing circuits into serial data and outputting said serial data to the outside.

4. A semiconductor integrated circuit according to claim 2, wherein each of first, second, and third processing circuits executes the processing operation by using a plurality of data from said memory cell array and a predetermined constant.

5. A semiconductor integrated circuit according to claim 1, further comprising: a first serial access memory for storing serial data inputted from the outside and outputting said serial data in parallel to said plurality of data lines; and a second serial access memory for transforming the output data of said plurality of processing circuits into serial data and outputting said serial data to the outside.

6. A semiconductor integrated circuit according to claim 5, wherein each of first, second, and third processing circuits executes the processing operation by using a plurality of data from said memory cell array and a predetermined constant.

7. A semiconductor integrated circuit according to claim 1, wherein each of first, second, and third processing circuits executes the processing operation by using a plurality of data from said memory cell array and a predetermined constant.

8. A semiconductor integrated circuit according to claim 1, further comprising:
   a first serial access memory for storing serial data inputted from the outside and outputting said serial data in parallel to said plurality of data lines; and
   a second serial access memory for transforming the output data of said plurality of processing circuits into serial data and outputting said serial data to the outside.

9. A semiconductor integrated circuit according to claim 8, wherein said serial data inputted to said first serial data memory are pixel data of an image.

10. A semiconductor integrated circuit according to claim 9, further comprising:
    a data memory for storing filter coefficients, wherein each of said first, second, and third processing circuits execute the filter processing operations of the image based on said pixel data and said filter coefficients.

11. A semiconductor integrated circuit comprising:
    a memory cell array including a plurality of data line groups, a plurality of word lines intersecting said plurality of data line groups, and a plurality of memory cells disposed at desired intersections between said plurality of data line groups and said plurality of word lines;
    a parallel data transfer circuit for transferring a plurality of data groups in parallel from said plurality of data line groups; and
    a plurality of processing circuits for receiving said plurality of data groups transferred from said parallel data transfer circuit, as their input signals,
    wherein said parallel data transfer circuit is enabled to transfer two or more of said plurality of data groups to each of said plurality of processing circuits by sequentially selecting two or more of said plurality of data line groups and coupling to each of said plurality of processing circuits and wherein the adjoining ones of said plurality of processing circuits can input the same data group from the same data line groups.

12. A semiconductor integrated circuit according to claim 11, wherein each of said plurality of processing circuits execute the processing operations by using the plurality of data groups which are read out to one of said plurality of data line groups by selecting two or more of said plurality of word lines.

13. A semiconductor integrated circuit according to claim 12, further comprising: a first serial access memory for storing serial data inputted from the outside and outputting said serial data in parallel to said plurality of data line groups; and a second serial access memory for transforming the output data of said plurality of processing circuits into serial data and outputting said serial data to the outside.

14. A semiconductor integrated circuit according to claim 12, wherein each of said plurality of processing circuits executes the processing operation by using said plurality of data groups from said memory cell array and a predetermined constant.

15. A semiconductor integrated circuit according to claim 11, further comprising: a first serial access memory for storing serial data inputted from the out side and outputting said serial data in parallel to said plurality of data line groups; and a second serial access memory for transforming the output data of said plurality of processing circuits into serial data and outputting said serial data to the outside.

16. A semiconductor integrated circuit according to claim 15, wherein each of said plurality of processing circuits executes the processing operation by using said plurality of data groups from said memory cell array and a predetermined constant.

17. A semiconductor integrated circuit according to claim 11, wherein each of said plurality of processing circuits executes the processing operation by using said plurality of data groups from said memory cell array and a predetermined constant.

18. A semiconductor integrated circuit comprising:

first and second memory cell arrays each of which including a plurality of data lines, a plurality of word lines intersecting said plurality of data lines, and a plurality of memory cells disposed at desired intersections between said plurality of data lines and said plurality of word lines;

a first parallel data transfer circuit coupled to first group, second group, and third group data lines of said plurality of data lines of said first memory cell array;

a second parallel data transfer circuit coupled to first group, second group, and third group data lines of said plurality of data lines of said second memory cell array; and first, second, and third processing circuits coupled to said first and second parallel data transfer circuits, wherein said first parallel data transfer circuit selects one of said first group, second group, and third group data lines of said plurality of data lines of said first memory cell array, wherein the adjoining ones of said first, second, and third processing circuits can couple to the same data lines of said first memory cell array, and wherein said second parallel data transfer circuit selects one of said first group, second group, and third group data lines of said plurality of data lines of said second memory cell array.

19. A semiconductor integrated circuit according to claim 18, wherein said processing operation uses two-dimensional data stored in said first memory cell array.

20. A semiconductor integrated circuit according to claim 19, further comprising:

a first serial access memory for storing serial data inputted from the outside and outputting said serial data in parallel to said plurality of data lines of said first memory cell array;

a second serial access memory for storing serial data inputted from the outside and outputting said serial data in parallel to said plurality of data lines of said second memory cell array; and, a third serial access memory for transforming the output data of said plurality of processing circuits into serial data and outputting said serial data to the outside.

21. A semiconductor integrated circuit according to claim 20, wherein said serial data inputted to said first serial data access memory are pixel data of a reference image; and, said serial data inputted to said second serial data access memory are pixel data of an input image.

22. A semiconductor integrated circuit according to claim 21, further comprising:

third and fourth memory cell arrays each of which includes a plurality of data lines, a plurality of word lines intersecting said plurality of data lines, and a plurality of memory cells disposed at desired intersections between said plurality of data lines and said plurality of word lines;

wherein each of said plurality of data lines of said third memory cell array is coupled to each of said plurality of data lines of said first memory cell array;

wherein each of said plurality of data lines of said fourth memory cell array is coupled to each of said plurality of data lines of said second memory cell array; and, wherein said processing circuits execute the processing operation while said third and fourth memory cell arrays store data for the following operation.

23. A semiconductor integrated circuit according to claim 22, wherein said processing circuits process the moving vector of a moving image by using pixel data of an input image and a reference image.

24. A semiconductor integrated circuit comprising:

first and second memory cell arrays each of which including a plurality of data line groups, a plurality of word lines intersecting said plurality of data line groups, and a plurality of memory cells disposed at desired intersections between said plurality of data line groups and said plurality of word lines;

a first parallel data transfer circuit for transferring a plurality of first data groups in parallel from said plurality of data line groups of said first memory cell array;

a second parallel data transfer circuit for transferring a plurality of second data groups in parallel from said plurality of data line groups of said second memory cell array, and a plurality of processing circuits for receiving said plurality of first and second data groups transferred from said first and second parallel data transfer circuits, as their input signals, wherein said first parallel data transfer circuit is enabled to transfer two or more of said plurality of first data groups to each of said plurality of processing circuits by sequentially selecting two or more of said plurality of first data line groups and coupling to each of said plurality of processing circuits, wherein the adjoining ones of said plurality of processing circuits can input the same data group from the same data line groups, and wherein said second parallel data transfer circuit is enabled to transfer two or more of said plurality of second data groups to each of said plurality of processing circuits by sequentially selecting two or more of said plurality of second data line groups and coupling to each of said plurality of processing circuits.

25. A semiconductor integrated circuit according to claim 24, further comprising:

a first serial access memory for storing serial data inputted from the outside and outputting said serial data in parallel to said plurality of data lines of said first memory cell array;

a second serial access memory for storing serial data inputted from the outside and outputting said serial data in parallel to said plurality of data lines of said second memory cell array; and, a third serial access memory for transforming the output data of said plurality of processing circuits into serial data and outputting said serial data to the outside.

26. A semiconductor integrated circuit according to claim 25, wherein said serial data inputted to said first serial data access memory are pixel data of a reference image; and, said serial data inputted to said second serial data access memory are pixel data of an input image.

27. A semiconductor integrated circuit according to claim 26, further comprising:

third and fourth memory cell arrays each of which includes a plurality of data lines, a plurality of word lines intersecting said plurality of data lines, and a plurality of memory cells disposed at desired intersections between said plurality of data lines and said plurality of word lines;

each of said plurality of data lines of said third memory cell array couples to each of said plurality of data lines of said first memory cell array;

each of said plurality of data lines of said fourth memory cell array couples to each of said plurality of data lines of said second memory cell array; and, wherein said processing circuits execute the processing operation while said third and fourth memory cell arrays store data for the following operation.

28. A semiconductor integrated circuit according to claim 27, said processing circuits process the moving vector of a moving image by using pixel data of an input image and a referenced image.

* * * * *

UNITED STATES PATENT AND TRADEMARK OFFICE
CERTIFICATE OF CORRECTION

PATENT NO. : 5,854,636
DATED : December 29, 1998
INVENTOR(S) : Takao Watanabe, et al.

It is certified that error appears in the above-identified patent and that said Letters Patent is hereby corrected as shown below:

Delete claim 8.

Claim 9, column 14, line 45, delete "8" and insert therefor --5--;

claim 9, column 14, line 45, delete second occurrence of "data" and insert therefor --access--;

claim 10, column 14, line 51, delete "execute the" and insert therefor --executes a--;

claim 10, column 14, line 51, delete "operations" and insert therefor --operation--;

claim 12, column 15, line 9, delete "execute" and insert therefor --executes--;

Col.15-claim 19, column 16, line 4, delete "18" and insert therefor -- 8 --;

claim 19, column 16, line 5, after "said" insert --filter--;

claim 20, column 16, line 18, delete "plurality of" and insert therefor --first, second, and third--;

claim 21, column 16, line 22, delete second occurrence of "data";

UNITED STATES PATENT AND TRADEMARK OFFICE
CERTIFICATE OF CORRECTION

PATENT NO. : 5,854,636

DATED : December 29, 1998

INVENTOR(S) : Takao Watanabe et al.

It is certified that error appears in the above-identified patent and that said Letters Patent is hereby corrected as shown below:

claim 21, column 16, line 24, before "said serial data" insert --wherein--;

claim 21, column 16, line 24, delete second occurrence of "data";

Col.16-claim 22, column 16, line 40, after said insert --first, second, and third-- claim 23, column 16, line 45, before "processing" insert --first, second, and third--;

claim 25, column 17, line 20, delete "lines" and insert therefor --line groups--;

claim 25, column 17, line 24, delete "lines" and insert therefor --line groups--;

claim 26, column 18, line 1, delete second occurrence of "data";

claim 26, column 18, line 3, before "said serial" insert --wherein--;

claim 26, column 18, line 3, delete second occurrence of "data";

UNITED STATES PATENT AND TRADEMARK OFFICE
CERTIFICATE OF CORRECTION

PATENT NO. : 5,854,636
DATED : December 29, 1998
INVENTOR(S) : Takao Watanabe, et al.

It is certified that error appears in the above-identified patent and that said Letters Patent is hereby corrected as shown below:

delete claim 27 and insert new claim 27:

--27. A semiconductor integrated circuit according to claim 25, further comprising:

third and fourth memory cell arrays each of which includes a plurality of data line groups, a plurality of word lines intersecting said plurality of data line groups, and a plurality of memory cells disposed at desired intersections between said plurality of data line groups and said plurality of word lines;

wherein each of said plurality of data line groups of said third memory cell array couples to each of said plurality of data line groups of said first memory cell array;

wherein each of said plurality of data line groups of said fourth memory cell array couples to each of said plurality of data line groups of said second memory cell array; and, wherein said plurality of processing circuits execute the processing operation while said third and fourth memory cell arrays store data for the following operation.--;

UNITED STATES PATENT AND TRADEMARK OFFICE
CERTIFICATE OF CORRECTION

PATENT NO. : 5,854,636
DATED : December 29, 1998
INVENTOR(S) : Takao Watanabe, et al.

It is certified that error appears in the above-identified patent and that said Letters Patent is hereby corrected as shown below:

claim 28, column 18, line 24, after "said" insert --plurality of--.

Signed and Sealed this

Thirteenth Day of July, 1999

Attest:

Q. TODD DICKINSON

*Attesting Officer*  *Acting Commissioner of Patents and Trademarks*